United States Patent [19]

Shiga

[11] Patent Number: 5,396,101
[45] Date of Patent: Mar. 7, 1995

[54] INDUCTANCE ELEMENT

[75] Inventor: Nobuo Shiga, Kanagawa, Japan

[73] Assignee: Sumitomo Electric Industries, Ltd., Osaka, Japan

[21] Appl. No.: 223,811

[22] Filed: Apr. 6, 1994

Related U.S. Application Data

[63] Continuation of Ser. No. 907,024, Jul. 1, 1992, abandoned.

[30] Foreign Application Priority Data

Jul. 3, 1991 [JP] Japan .................. 3-163052
Jul. 3, 1991 [JP] Japan .................. 3-163066

[51] Int. Cl.6 ........................... H01L 27/02
[52] U.S. Cl. .................. 257/531; 257/528; 257/773
[58] Field of Search ............ 257/295, 425, 427, 528, 257/531, 741, 773

[56] References Cited

U.S. PATENT DOCUMENTS

| 3,798,059 | 3/1974 | Astle et al. | |
|---|---|---|---|
| 4,494,100 | 1/1985 | Stengel et al. | |
| 4,689,594 | 8/1987 | Kawabata et al. | |
| 4,710,478 | 12/1987 | Yoder et al. | 257/347 |
| 5,095,357 | 3/1992 | Andoh et al. | 257/379 |
| 5,227,659 | 7/1993 | Hubbard | 257/741 |

FOREIGN PATENT DOCUMENTS

| 0310396 | 4/1989 | European Pat. Off. | |
|---|---|---|---|
| 3-19358 | 1/1991 | Japan | 257/531 |

Primary Examiner—J. Carroll
Attorney, Agent, or Firm—Cushman Darby & Cushman

[57] ABSTRACT

An inductance element for use in a microwave integrated circuit for processing high-frequency signals ranging from hundreds of MHz to tens of GHz. A conductor wiring in the form of a thin film is formed by sputtering or the like on a semi-insulating compound semiconductor substrate of GaAs for instance. This conductor wiring is about 2–20 μm wide. The intersection between a lead wire from the inner end of the conductor wiring and a spiral coil are insulated by means of an air bridge and the like to form a spiral inductor. A core portion made of high permeability magnetic material is provided in the central portion of the spiral inductor and may be divided into a grid of many small square insulated members. The core portion is directly formed on the substrate by, for instance, sputtering high permeability magnetic material such as nickel. With such an inductance element, the same inductance can be obtained as before but with a miniaturized element.

6 Claims, 2 Drawing Sheets

INDUCTANCE ELEMENT

This is a continuation of application No. 07/907,024, filed on Jul. 1, 1992, which was abandoned upon the filing hereof.

BACKGROUND OF THE INVENTION

1. Field of the Invention

The present invention relates to an inductance element, and more particularly to an inductance element for use in a microwave integrated circuit for processing high-frequency signals ranging from hundreds of MHz to tens of GHz.

2. Description of the Related Art

Due to the recent rapid development of information networks, a demand for satellite communication systems has remarkably increased with a higher range of frequencies within frequency-band designations often selected. Schottky barrier field effect transistors (MESFETs) using GaAs compound-semiconductors, for instance, have been put into practical use as high-frequency field effect transistors. Moreover, the integration of the initial-stage amplifier unit of a down converter for converting high frequencies to low frequencies (e.g., the application of MMIC: Monolithic Microwave Integrated Circuit) is progressing for the purpose of not only minimizing the system and reducing manufacturing cost but also improving performance of the system.

The reason for applying an MMIC to a communication system that has employed a number of discrete elements is attributed to the fact that circuitry integration makes it possible to decrease the number of parts, thus reducing packaging cost. Consequently, system reliability is improved as the number of connections is decreased and the resulting mass production effect facilitates cost reduction in comparison with a case where a larger number of discrete elements are used for the same purpose.

With such an MMIC, however, it is impossible to fit a coil, formed by axially winding a lead wire, onto the MMIC as an inductance element as such a circuit, being built of a number of discrete elements, is required to be arranged in one plane.

Consequently, a distributed constant line element such as a micro strip line, is employed in the MMIC for use in frequency bands around 10 GHz or over, with desired inductance level by obtained setting the shape, width and the like of the relevant strip line properly. In this case, however, the area occupied by the element tends to increase and this tends to become problematic in MMIC for use at low frequency bands. In MMIC, moreover, the yield rate lowers as the chip size increases, which then becomes detrimental to cost reduction per chip because the relative number of chips obtainable from one sheet of semiconductor substrate decreases.

In order to solve the foregoing problems accompanying the related art system, there has been proposed a so-called spiral inductor in which a conductor line having width of about 2-20 [μm] is formed on a substrate in a spiral manner.

However, such an arrangement, where a conductor line having width of about 2-20 [μm] is arranged spirally, leads to the spiral inductor being substantially square in shape. Although it is advantageous in that the area occupied in this case is smaller than that of an ordinary distributed constant element, it becomes disadvantageous in that the degree of freedom in designing a layout of the circuit on the substrate becomes restricted because of the square shape. When these various kinds of wiring are actually carried out, a dead space develops, thereby resulting in an increase in chip size on the whole, which ultimately affects its yield rate and cost.

Particularly in case of the distributed constant element, the chip size, instead of decreasing, may actually increase with the use of the spiral inductor depending on the desired inductance value and the circuit arrangement, since the degree of freedom in designing the layout is high reduced.

SUMMARY OF THE INVENTION

In view of the above, it is an object of the present invention to provide an inductance element so designed as to occupy a smaller area.

In order to accomplish the object, an inductance element is formed by arranging spiral conductor wiring in one plane on a semi-insulating compound semiconductor substrate, and a core portion made of high permeability magnetic material is provided in the central portion of the spiral formed by the conductor wiring.

Further, the core portion is formed with a plurality of small members divided and insulated from each other.

The provision of the core portion made of high permeability magnetic material in the central portion of the spiral conductor wiring results in increasing the permeability of the element on the whole, whereby the same L can be obtained as before with a smaller number of turns.

Moreover, a plurality of small members separated and insulated from each other are combined to form the core portion, so that eddy current is prevented from flowing through the core portion. Consequently, the upper limit of an operating frequency for use is elevated.

BRIEF DESCRIPTION OF THE DRAWINGS

The accompanying drawings, which are incorporated in and constitute a part of the specification, illustrated presently preferred embodiments of the invention and, together with the general description given above and the detailed description of the preferred embodiments given below, serve to explain the principles of the invention. In the accompanying drawings.

DESCRIPTION OF THE PREFERRED EMBODIMENTS

Referring to the accompanying drawings, a preferred embodiment of the present invention relating to an inductance element will be described.

Figure 1:
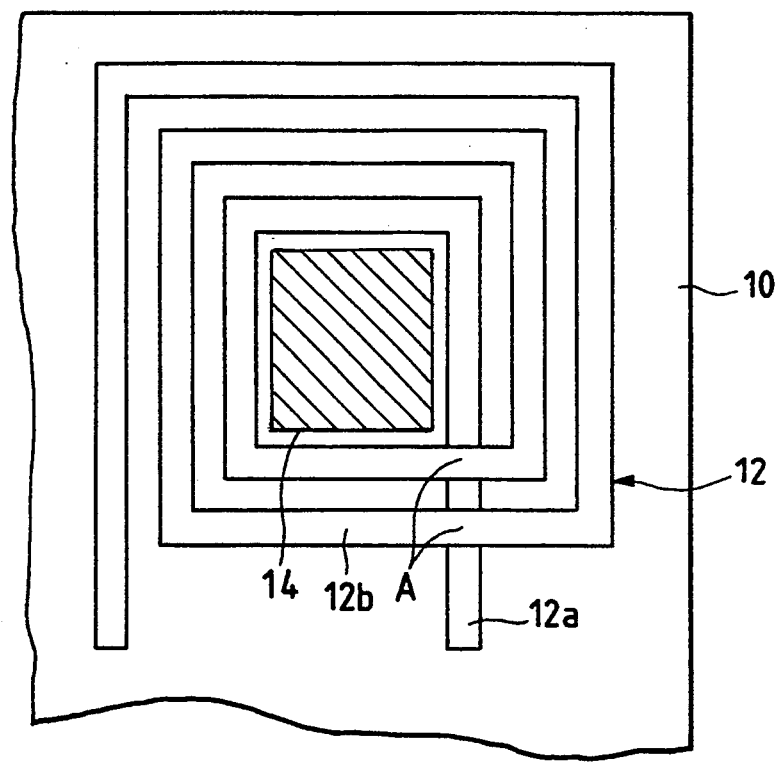
FIG. 1 is a plan view of a first embodiment of an inductance element according to the present invention.

FIG. 1 is a plan view of a first embodiment of an inductance element according to the present invention. As shown in FIG. 1, conductor wiring 12 in the form of a thin film of gold or the like is formed by vapor deposition or sputtering on a semi-insulating compound semiconductor substrate 10 such as GaAs. In this embodiment, the conductor wiring 12, being about 2–20 μm in width, is spirally arranged and substantially square. However, that shape is not limited to this example but may be substantially circular and optional. Intersections A between a lead wire 12a from the inner end and a spiral coil 12b are insulated by means of an air bridge.

According to the present invention, a core portion 14 which is planar and substantially square as a whole, is provided in the central space of coil portion 12b where no conductor wiring 12 exists. In this case, high permeability magnetic material such as nickel is used to form the core portion 14 directly on the substrate 10 by way or vapor deposition or sputtering.

Figure 2:
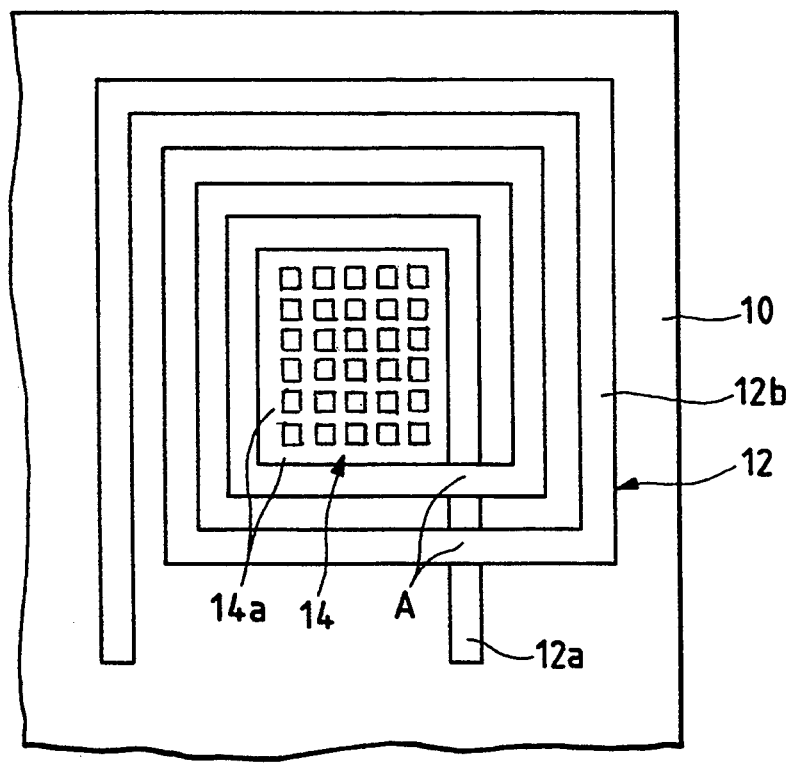
FIG. 2 is also a plan view of a second embodiment of an inductance element according to the present invention.

Further, according to the invention, the core portion 14 may be divided into a grid of many small square members 14a with one side about 1 μm long as shown in FIG. 2. These small members 14a as a whole are used to form the core portion 14. Although the space between members 14a has to be insulated, it is only necessary to provide a portion where no nickel layer is formed on the substrate, as shown in FIG. 2, when the core portion 14 is arranged in one plane.

Furthermore, sputtering equipment and nickel material used during the process of manufacturing ordinary MMIC can be directly used in this embodiment since the core portion 14 is formed by sputtering nickel. Therefore, no problems of cost increase and the like arise because the manufacturing of such a core portion can be dealt with only by increasing the man-hour without the necessity of adding any new special process step.

Although it is preferred to use a mask having a pattern corresponding to the grid of many small members 14a when they are actually formed, the core portion 14 may be formed through two steps of forming a large square core portion, and once on the substrate, removing spaces in predetermined positions. In other words, the manufacturing process is flexible.

Although the shape of the core portion 14 demonstrated here has been set square to conform with the shape of the spirally wound coil 12a, the core portion 14 may be circular when a circular spiral coil is employed or may be shaped in any form irrelevant to the spiral form. This is also the case with the shape of each small member.

Figure 3:
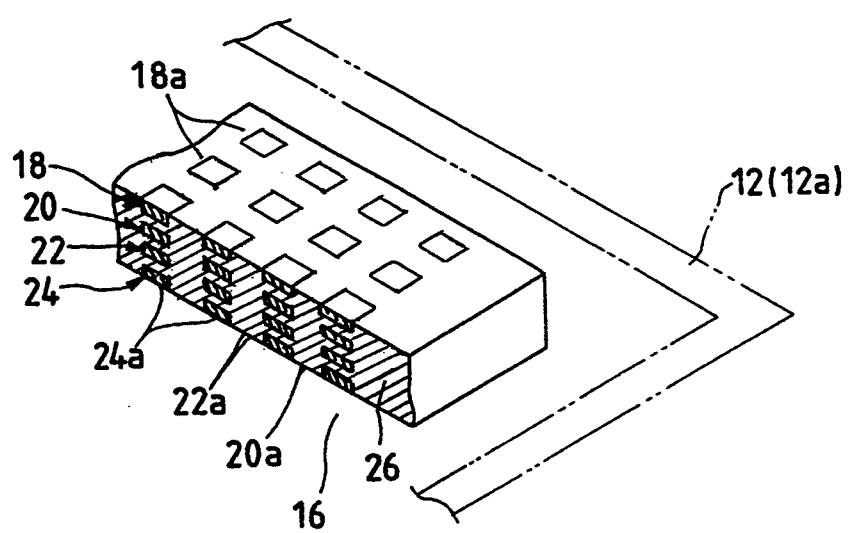
FIG. 3 is a schematic diagram illustrating a partial cross-section of a core portion of a third embodiment of an inductance element of the present invention.

FIG. 3 is an enlarged perspective view of a core portion cut in its height direction, representing a third embodiment of the present invention. As shown in FIG. 3, a core portion 16 is formed by stacking a plurality of layers (four layers in this example) of the core portions 14, each of which includes a plurality of small members 14a of the first embodiment. More specifically, the core portion 16 in this embodiment is formed of first thru fourth core members 18, 20, 22, 24 constituting the respective layers and a dielectric thin film 26 about 0.1–0.3 μm thick which is held among the core members 18, 20, 22, 24, whereby the adjoining core members are insulated from each other. Moreover, the dielectric thin film 26 also functions as an insulating material among the small members 18a, 20a, 22a, 24a of the respective core members 18, 20, 22, 24.

The permeability of the inductance element can be increased on the whole as the core portion is formed in the central space of the spiral conductor wiring thereof according to the present invention and therefore a high inductance value is obtainable with a relatively small number of turns.

Consequently, the attempt to reduce the size of the element can be implemented, and since the degree of freedom in laying out the circuit increases at the time it is actually assembled, not only the area occupied by the element but also that of the whole chip as a final product can be reduced. This results in reducing the cost per chip.

Moreover, the number of intersections between the lead wire from the inner end of the conductor wiring and the spiral portion decreases as the number of turns decreases. Further, the number of insulating operations at these intersections decreases, so that the process of manufacture is simplified with the secondary effect of reducing cost.

In addition, the eddy current is restrained from flowing through the core portion even at high frequencies since it is formed of the plurality of divided small members. As a result, the upper limit of an operating frequency for use is elevated.

What is claimed is:

1. An inductance element having more than one coil formed by arranging spiral conductor wiring in one plane on a semi-insulating compound semiconductor substrate, wherein only a central portion of the spiral formed by said conductor wiring includes a core portion made of high permeability magnetic material.

2. The inductance element as defined in claim 1 wherein said core portion comprises a plurality of small members divided and insulated from each other.

3. The inductance element as defined in claim 1 wherein said semi-insulating compound semiconductor substrate is a GaAs substrate.

4. The inductance element as defined in claim 2 wherein said semi-insulating compound semiconductor substrate is a GaAs substrate.

5. The inductance element as defined in claim 1 wherein said high permeability magnetic material is nickel.

6. The inductance element as defined in claim 2 wherein said high permeability magnetic material is nickel.

* * * * *